United States Patent [19]

Kohdaka et al.

[11] Patent Number: 5,021,785
[45] Date of Patent: Jun. 4, 1991

[54] FLOATING POINT DIGITAL TO ANALOG CONVERTER WITH BIAS TO ESTABLISH RANGE MIDPOINT

[75] Inventors: Takayuki Kohdaka; Katsuhiko Ishida; Toshiyuki Takahashi; Takashi Ogata, all of Hamamatsu, Japan

[73] Assignee: Yamaha Corporation, Hamamatsu, Japan

[21] Appl. No.: 463,876

[22] Filed: Jan. 5, 1990

Related U.S. Application Data

[63] Continuation of Ser. No. 115,581, Oct. 23, 1987, abandoned, which is a continuation of Ser. No. 781,767, Sep. 30, 1985, abandoned.

[30] Foreign Application Priority Data

Oct. 4, 1984 [JP] Japan ................. 59-208749
Jun. 1, 1985 [JP] Japan ................. 60-119525

[51] Int. Cl.$^5$ ............................................. H03M 1/70
[52] U.S. Cl. ............................... 341/138; 341/154
[58] Field of Search ............... 341/138, 139, 144, 145, 341/153, 154

[56] References Cited

U.S. PATENT DOCUMENTS

| | | | |
|---|---|---|---|
| 3,303,489 | 2/1967 | Krucoff | 341/139 |
| 3,555,540 | 1/1971 | Hartke | 341/139 |
| 3,670,326 | 6/1972 | Sloane | 341/138 |
| 3,673,398 | 6/1972 | Loffbourrow | 341/139 |
| 3,705,359 | 12/1972 | Kappes | 341/143 |
| 4,062,013 | 12/1977 | Nagahama | 341/138 |
| 4,250,492 | 2/1981 | Yamakido | 341/108 |
| 4,305,063 | 12/1981 | Hanson | 341/87 |
| 4,618,851 | 10/1986 | Watanabe | 341/139 |
| 4,727,355 | 2/1988 | Kohdaka et al. | 341/154 |
| 4,951,054 | 8/1990 | Kohdaka et al. | 341/138 |

FOREIGN PATENT DOCUMENTS

58-170114 6/1983 Japan .

OTHER PUBLICATIONS

Hnatek, "A User's Handbook of D/A and A/D Converters", 6/1976, pp. 90–91.

Primary Examiner—J. R. Scott
Assistant Examiner—H. L. Williams
Attorney, Agent, or Firm—Spensley, Horn, Jubas & Lubitz

[57] ABSTRACT

A digital-to-analog converter converts digital data in the floating-point representation into an analog signal. The mantissa part of the digital data is first converted into a first analog signal by an R-2R resistor ladder network. The first analog signal thus obtained is directly supplied to another r-2r resistor ladder network to produce second analog signals whose values are $2^{-N}(N=0, 1, 2, \ldots)$ magnifications of the first analog signal. And, one of the second analog signals is selectively outputted in accordance with the exponent part of the digital data. A data converter is also provided for converting digital data in the form of a fix-point number into floating point data.

1 Claim, 4 Drawing Sheets

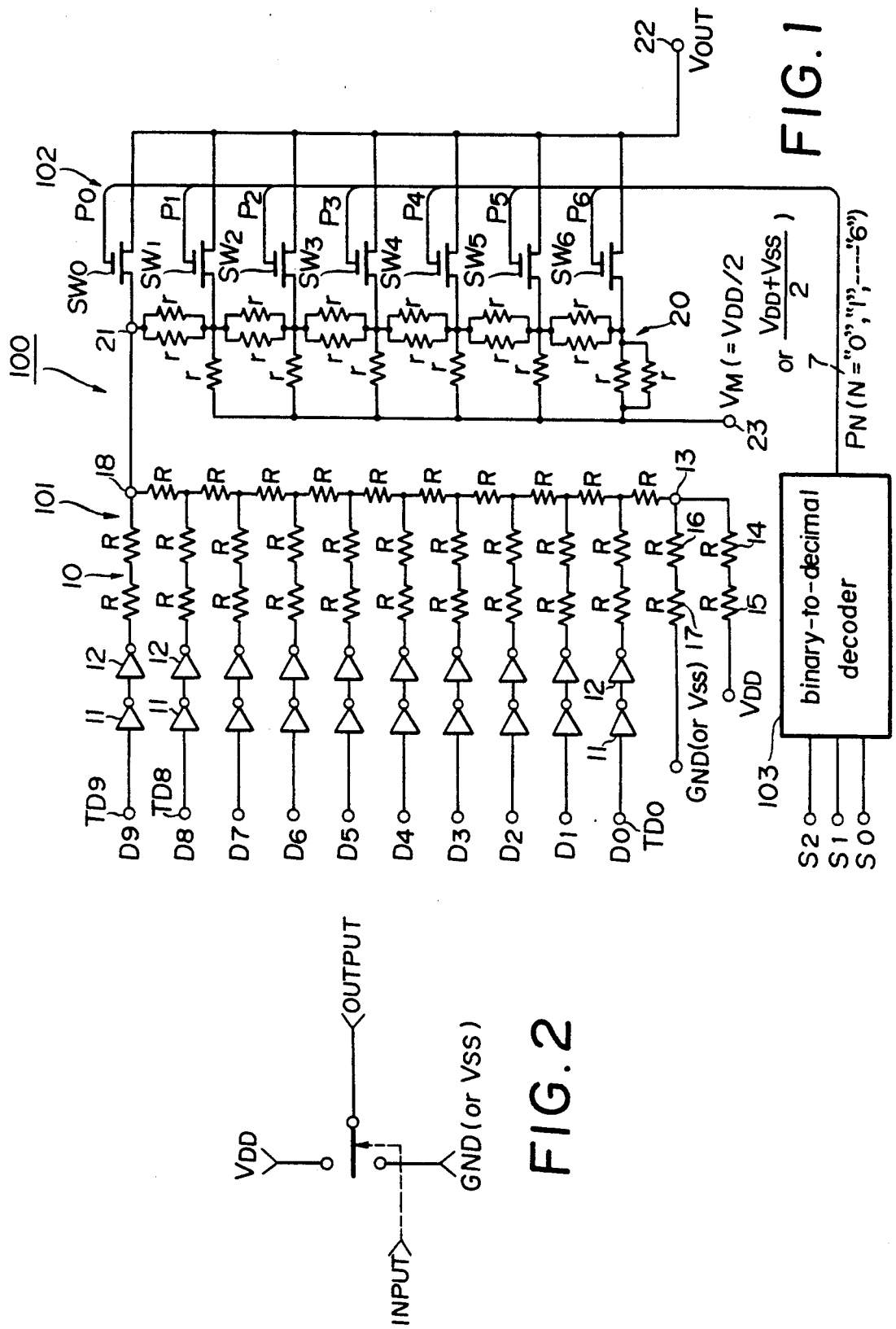

SHIFT NUMBER DETECTION CIRCUIT 107

DATA SHIFT CIRCUIT 106

FLOATING POINT DIGITAL TO ANALOG CONVERTER WITH BIAS TO ESTABLISH RANGE MIDPOINT

This is a continuation of copending application Ser. No. 07/115,581 filed on Oct. 23, 1987, which is a continuation of Ser. No. 06/781,767 filed Sept. 30, 1985, both now abandoned.

BACKGROUND OF THE INVENTION

1. Field of the Invention

This invention relates to a digital-to-analog converter suitable for use in, for example, a digital audio device.

In a signal reproduction circuit of a digital audio device such as a compact disc player, a digital signal reproduced from a recording medium is converted into an analog signal. In such a case, since the digital reproduction signal generally takes the form of a binary fixed-point number, a digital-to-analog converter (hereinafter referred to as "D/A converter") of the type in which all bits of the digital reproduction signal are directly supplied to a weighted register network or an R-2R resistor ladder network is generally used.

As is well known, one of the most important features of a digital audio device is the reproducibility of a small signal with less distortion. It is also well known that distortion contained in the output signal of a D/A converter of this type increases with the decrease of magnitude of the input data. And therefore, for example, when it is desired to reproduce a signal at a level of −60 dB (full-scale level is 0 dB) with a distortion less than 1%, the D/A converter must have such a high accuracy that a signal at a level of 0 dB can be reproduced with a distortion less than 0.001%, which accuracy is equivalent to fifteen to sixteen bits. However, it is extremely difficult to improve the accuracy of a D/A converter of this type to such an extent.

SUMMARY OF THE INVENTION

It is therefore an object of the present invention to provide a D/A converter which can convert a digital signal into an analog signal with less distortion even when the magnitude of the digital input signal is small.

It is another object of the present invention to provide such a D/A converter which can deal with a digital input data in the form of a fixed-point number.

According to one aspect of the present invention, there is provided a digital-to-analog converter of the floating-point type which converts digital data in the floating-point representation composed of a mantissa part and an exponent part into an analog output signal comprising an R-2R resistor ladder network for converting the mantissa part into a first analog signal, each 2R resistor of the R-2R resistor ladder network being supplied with a corresponding bit of the mantissa part, the first analog signal being derived from one terminal end of the R-2R ladder network; an r-2r resistor ladder network directly connected at one terminal end thereof to the one terminal end of the R-2R resistor ladder network for producing second analog signals whose voltages are $2^{-n}$ (n=0, 1, 2, 3, ...) magnifications of the first analog signal; and switch circuit means connected to the r-2r resistor ladder network for selectively outputting one of the second analog signals as the analog output signal in accordance with the exponent part of the digital data.

According to another aspect of the present invention, there is provided a digital-to-analog converter for converting fixed-point binary data into an analog output signal comprising data converting means for converting the fixed-point binary data into floating point digital data composed of a mantissa part and an exponent part; digital-to-analog converting means for converting the mantissa part into a first analog signal; circuit means responsive to the first analog signal to produce second analog signals whose voltages are $2^{-n}$ (n=0, 1, 2, 3, ...) magnifications of the first analog signal; and switch circuit means connected to the circuit means for selectively outputting one of the second analog signals as the analog output signal in accordance with the exponent part of the floating point data.

BRIEF DESCRIPTION OF THE DRAWINGS

FIG. 1 is a circuit diagram of a D/A converter 100 provided in accordance with the present invention;

FIG. 2 is a circuit diagram of an equivalent circuit of each of the inverters 11 and 12 of the D/A converter 100 of FIG. 1;

DESCRIPTION OF THE PREFERRED EMBODIMENTS OF THE INVENTION

Figure 3:
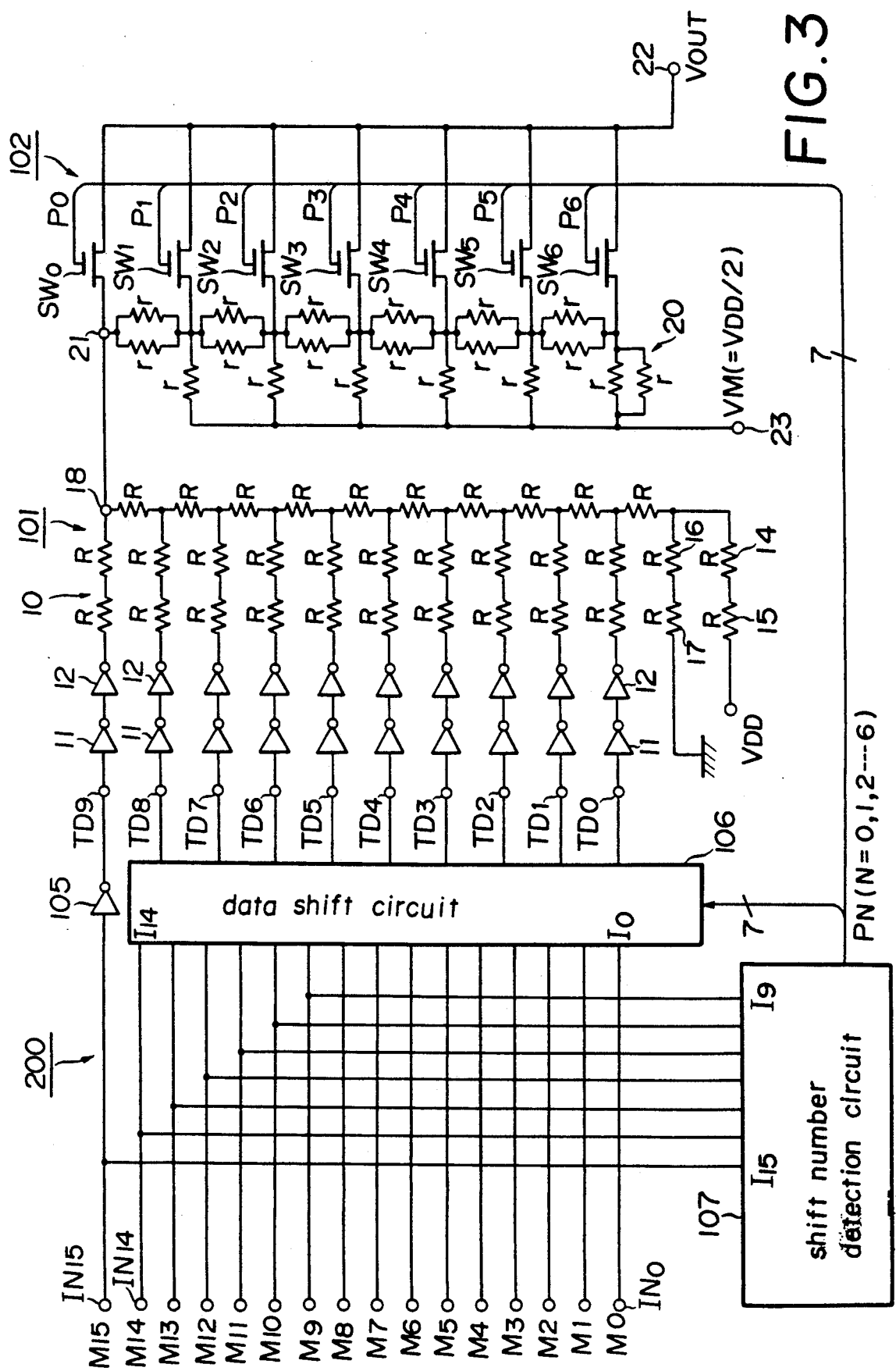
FIG. 3 is a circuit diagram of a modified D/A converter 200 provided in accordance with the present invention.

The embodiments of the invention will now be described with reference to the accompanying drawings in which like reference characters denote corresponding parts in several views.

Referring now to FIG. 1, there is shown a D/A converter 100 provided in accordance with the present invention. This D/A converter 100 is of a floating-point type which can implement a digital-to-analog conversion of a small signal with less distortion as will become apparent from the following description. Shown at $TD_9$ to $TD_0$ in FIG. 1 are input terminals for being supplied respectively with bits $D_9$ to $D_0$ of a ten-bit mantissa part (or fractional part) of a floating-point digital input data to be converted into an analog signal, the bit $D_9$ being the MSB (most significant bit) of the mantissa part. Each bit of the input data is supplied to a ten-stage R-2R resistor ladder network 10 through serially connected two inverters 11 and 12. Each stage of the ladder network 10 comprises a 2R resistor composed of serially connected two resistors each having a resistance value of R, which are disposed transversely of the ladder, and an R resistor composed of a resistor having a resistance value of R which is disposed longitudinally of the ladder. In this case, the bits $D_9$ to $D_0$ of the input data are fed respectively to the 2R resistors of the first (MSB) to tenth stages of the ladder network 10. Each of the inverters 11 and 12 is equivalent to an analog switch circuit shown in FIG. 2 which is so arranged that a voltage of $V_{DD}$ is outputted when a "1" signal is inputted and that a ground level signal is outputted when a "0" signal is inputted. The inverters 11 and 12 may alternatively output a voltage of $V_{SS}$, which is lower than the voltage $V_{DD}$, when a "0" signal is applied thereto. One terminal end 13 of the R-2R resistor ladder network 10 on the LSB (least significant bit) side is connected to a source of the reference voltage of $V_{DD}$ through serially connected two resistors 14 and 15 each having a resistance value of R. The terminal end 13 is also connected to the ground through serially connected resistors 16 and 17 each having a resistance value of R. The resistor 17 may alternatively be connected to a source of the voltage $V_{SS}$. And in this case, the inverters 11 and 12, the R-2R resistor ladder network 10 and the resistors 14 to 17 constitute a D/A conversion section 101 for the mantissa part.

Shown at 102 is a D/A conversion section for converting a three-bit exponent part of the digital input data. This D/A conversion section 102 analogically shifts the output voltage appearing at the other terminal end 18 of the ladder network 10 on the MSB side by an amount of voltage determined by the magnitude of the exponent part. The D/A conversion section 102 comprises a six-stage r-r/2 resistor ladder network 20 and seven analog switches $SW_0$ to $SW_6$ each comprising a field effect transistor (hereinafter referred to as "FET"). Each stage of the ladder network 20 except for the LSB stage comprises a $(\frac{1}{2})$r resistor composed of parallel-connected two resistors each having a resistance value of r and disposed longitudinally of the ladder and an r resistor composed of a resistor having a resistance value of r and disposed transversely of the ladder. The LSB stage of the ladder network 20 is composed of two $(\frac{1}{2})$r, resistors. The analog switch $SW_0$ is connected between one terminal end 21 of the ladder network 20 on the MSB side ( or a $2^0$ output terminal of the ladder network 20) and an output terminal 22 of this D/A converter 100, and the analog switch $SW_1$ is connected between the junction point of the $(\frac{1}{2})$r and r resistors of the MSB stage of the ladder network 20 (or a $2^{-1}$ output terminal of the ladder network 20) and the output terminal 22. In a similar manner, the analog switches $SW_2$ to $SW_6$ are connected respectively between $2^{-2}$ to $2^{-6}$ output terminals of the ladder network 20 and the output terminal 22. The analog switches $SW_0$ to $SW_6$ are so arranged that one of them is selectively conducted in accordance with an output of a binary-to-decimal decoder 103. The one terminal end 21 of the r-r/2 resistor ladder network 20 is connected to the terminal end 18 of the ladder network 10. The r resistors of the first (MSB) to fifth stages of the ladder network 20 and the transversely disposed $(\frac{1}{2})$r resistor of the LSB stage of the ladder network 20 are connected to a bias terminal 23 to which a bias voltage of $V_M$ equal in potential to half of the voltage $V_{DD}$ is supplied. This bias voltage $V_M$ defines the center of range of an output voltage $V_{OUT}$ of this D/A converter 100 which is derived from the output terminal 22. The voltage $V_M$ applied to the bias terminal 23 may alternatively be $(V_{DD}+V_{SS})/2$. The decoder 103 decodes bits $S_2$ (MSB) to $S_0$ (LSB) of the exponent part of the input data and outputs as the result of the decoding a signal $P_N$ ("N" is one of "0" to "6") to the D/A conversion section 102 to cause the Nth analog switch $SW_N$ to conduct. In this case, the "N" is expressed as follows:

$$N = S_2 \cdot 2^2 + S_1 \cdot 2^1 + S_0 \quad (1)$$

Also, the output voltage $V_{OUT}$ of the above-described D/A converter 100 is expressed by the following formula (2):

$$V_{OUT} = \tfrac{1}{2}V_{DD} + \tfrac{1}{2}V_{DD}(-1 + D_9 + D_8 \cdot 2^{-1} + \ldots D_0 \cdot 2^{-9} + 2^{-10}) \cdot 2^{-N} \quad (2)$$

As is appreciated from the formula (2), with the structure of the above-described floating-point type D/A converter 100, a dynamic range of ten bits can be obtained by the mantissa part and a dynamic range of six bits can be obtained by the exponent part. And therefore, this D/A converter 100 as a whole has a resolution of sixteen bits. Moreover, when the "N" is "6", that is, when the exponent part is minimum, an error contained in the output voltage $V_{OUT}$ is rendered $2^{-6}$ times smaller, so that zero-cross distortion at a small signal level is very small. Thus, with this D/A converter 100, D/A conversion can be achieved with less distortion even when the input data is small. In addition, this D/A converter 100 is advantageous in that the center of range of the output voltage $V_{OUT}$ can be set to any desired value by applying a proper bias voltage to the bias terminal 23.

Although the floating-point type D/A converter 100 has various advantages as described above, the input data to be applied thereto must be in the form of a floating-point number. And therefore, in the case where the data to be converted into an analog signal is ordinary binary data or data in a fixed-point form, the input data must be converted into data in a floating-point form. This is, however, troublesome.

A D/A converter 200 modified so that ordinary fixed-point binary data can be directly applied will now be described.

In FIG. 3, a digital input data of sixteen binary weighted bits $M_{15}$ to $M_0$ in two's complement form is supplied to input terminals $IN_{15}$ to $IN_0$ of the D/A converter 200. The MSB $M_{15}$ (sign bit) of the digital input data supplied to the input terminal $IN_{15}$ is inverted by an inverter 105 and fed to an input terminal $TD_9$ of a mantissa-part D/A conversion section 101 through serially connected two inverters 11 and 12. The remaining bits $M_{14}$ to $M_0$ supplied to the input terminals $IN_{14}$ to $IN_0$ are fed to input terminals $I_{14}$ to $I_0$ of a data shift circuit 106, respectively. Also, the bits $M_{15}$ to $M_9$ of the input data are supplied to input terminals $I_{15}$ to $I_9$ of a shift number detection circuit 107. This shift number detection circuit 107 selectively outputs one of seven signals $P_0$ to $P_6$ to the data shift circuit 106 and an exponent-part D/A conversion section 102 in accordance with the bits $M_{15}$ to $M_9$ of the input data.

Figure 4:
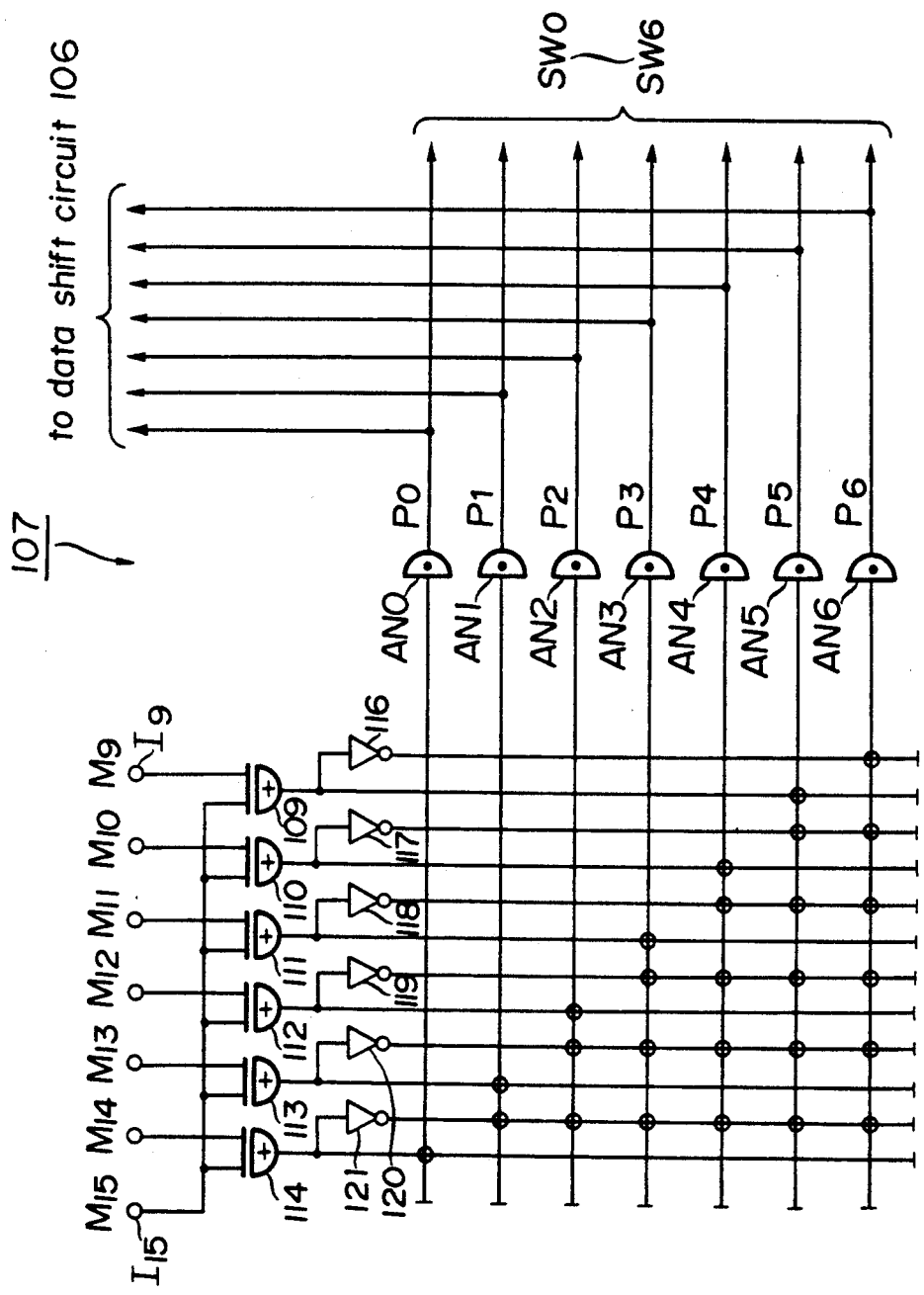
FIG. 4 is a circuit diagram of the shift number detection circuit 107 of the D/A converter 200 of FIG. 3.

As shown in FIG. 4, the shift number detection circuit 107 comprises six exclusive-OR gates 109 to 114 to which the bits $M_9$ to $M_{14}$ are supplied, respectively, at one input terminals thereof. The other input terminals of the exclusive-OR gates 109 to 114 are supplied with the bit $M_{15}$ of the input data. This shift number detection circuit 107 further comprises seven AND gates $AN_0$ to $AN_6$. Input terminals of each of the AND gates $AN_0$ to $AN_6$ are indicated by circles on an input signal line of the corresponding one of the AND gates. Output terminals of the exclusive-OR gates 114 to 109 are connected to the first input terminals of the AND gates $AN_0$ to $AN_5$, respectively. The output terminals of the exclusive-OR gates 109 to 114 are also connected to input terminals of inverters 116 to 121, respectively. An output terminal of the inverter 116 is connected to the first input terminal of the AND gate $AN_6$, and an output terminal of the inverter 117 is connected to the second input terminals of the AND gates $AN_5$ and $AN_6$. An output terminal of the inverter 118 is connected to the second input terminal of the AND gate $AN_4$ and the third input terminals of the AND gates $AN_5$ and $AN_6$. In a similar manner, an output terminal of the inverter 119 is connected to the input terminals of the AND gates $AN_3$ to $AN_6$, an output terminal of the inverter 120 to the input terminals of AND gates $AN_2$ to $AN_6$, and an output terminal of the inverter 121 to the input terminals of the AND gates $AN_1$ to $AN_6$. When 5 opened, the AND gates $AN_0$ to $AN_6$ output the signal $P_0$ to $P_6$, respectively. With this shift number detection circuit 107, when the bit $M_{15}$ is "0", that is to say, when the input data of this D/A converter 200 is a positive value, the "N" of the outputted signal $P_N$ is determined by the number of "0" bits of the input data counted from the bit $M_{14}$ toward the bit $M_9$ until a "1" bit is first detected. In other words, the "N" is determined by the number of leading "0" bits of the input data. For example, when the bit $M_{15}$ is "0" and if only the bits $M_{13}$ and $M_{11}$ are "1", the number of leading "0" bits of the input data is "1", so that the signal $P_1$ is outputted. On the other hand, when the bit $M_{15}$ is "1", that is to say, when the input data of this D/A converter 100 is negative, the "N" of the signal $P_N$ is determined by the number of "1" bits of the input data counted from the bit $M_{14}$ toward the bit $M_9$ until a "0" bit is first detected In other words, the "N" is determined by the number of leading "1" bits of the input data. For example, in the case where only the bits $M_{10}$ and $M_9$ are "0", the number of leading "1" bits of the input data is "4", so that the signal $P_4$ is outputted. Thus, the shift number detection circuit 107 determines the "N" of the signal $P_N$ based on the number of those bits of the input data which are counted from the bit $M_{14}$ toward the bit $M_9$ until a bit different in state from the bit $M_{15}$ is first detected. In the case where a bit which is different in state from the bit $M_{15}$ is not detected from the bits $M_{14}$ to $M_9$, the shift number detection circuit 107 outputs the signal $P_6$ irrespective of the state of the bit $M_{15}$. Thus, the shift number detection circuit 107 selectively outputs the signal $P_N$ ("N" is one of "0" to "6") in accordance with the absolute value of the input data represented by the bits $M_{14}$ to $M_0$, wherein the "N" becomes greater when the absolute value of the input data becomes smaller.

Figure 5:
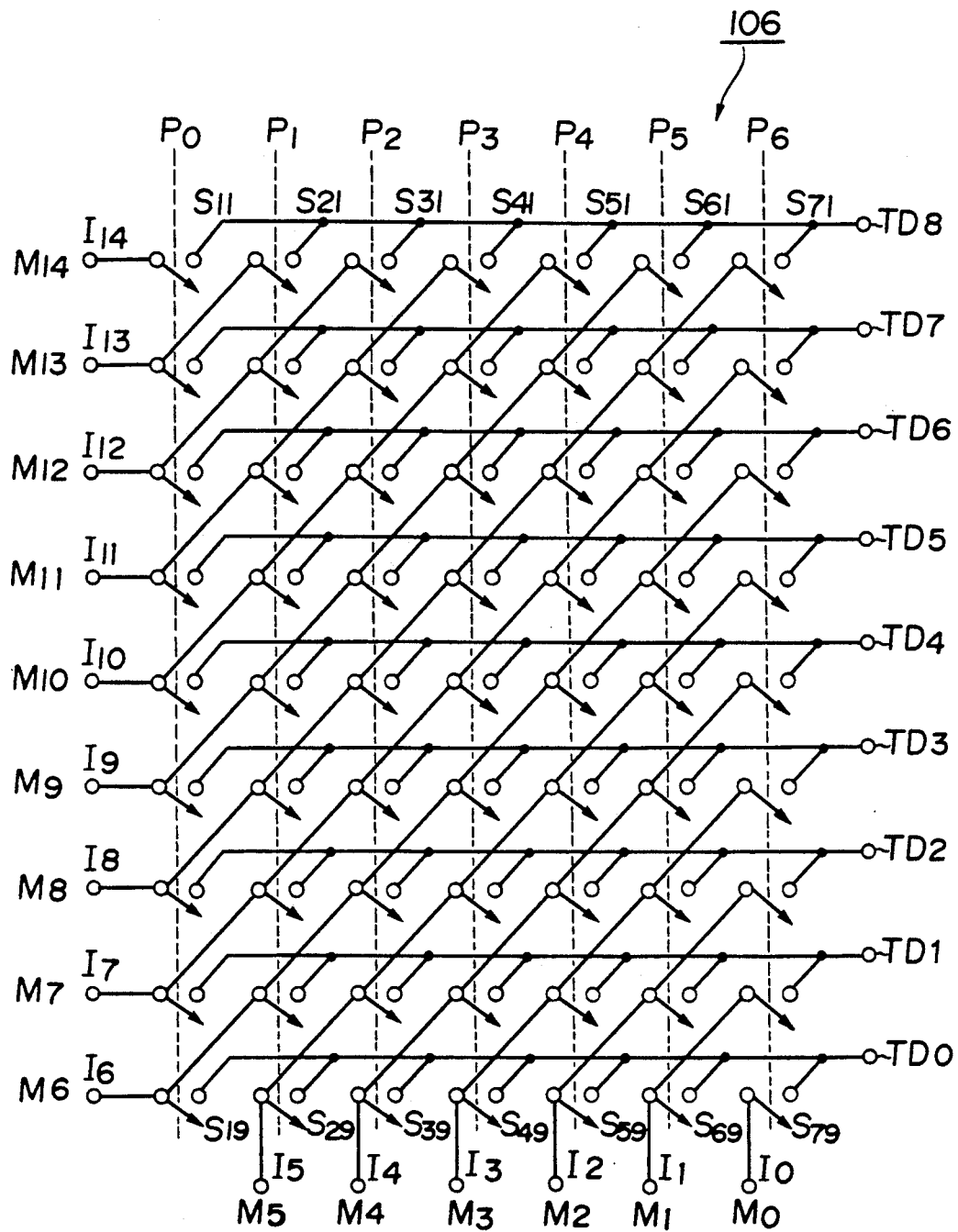
FIG. 5 is a circuit diagram of the data shift circuit 106 of the D/A converter 200 of FIG. 3.

The data shift circuit 106 shown in FIG. 3 selects, based on the signal $P_N$ supplied from the shift number detection circuit 107, consecutive nine bits among the bits $M_{14}$ to $M_0$ and supplies the selected consecutive nine bits respectively to input terminals $TD_8$ to $TD_0$ of the mantissa-part D/A conversion section 101. This data shift circuit 106 comprises seven columns of switches $S_{11}$ to $S_{19}$, $S_{21}$ to $S_{29}$, ... $S_{71}$ to $S_{79}$, as shown in FIG. 5. These switches may be constituted by FETs, transistors or the like. In this case, all of the switches of the same column are closed when the corresponding one of the signals $P_0$ to $P_6$ is applied thereto For example, the switches $S_{11}$ to $S_{19}$ of the first column are closed when the signal $P_0$ is supplied thereto. In this case, the bits $M_{14}$ to $M_6$ of the input data are supplied respectively to the input terminals $TD_8$ to $TD_0$ of the mantissa-part D/A conversion section 101. In a similar manner, when the signal $P_1$ is supplied to the data shift circuit 106, the switches $S_{21}$ to $S_{29}$ are closed, so that the bits $M_{13}$ to $M_5$ of the input data are supplied respectively to the input terminals $TD_8$ to $TD_0$ of the mantissa-part D/A conversion section 101 And, when the signal $P_6$ is supplied to the data shift circuit 106, the switches $S_{71}$ to $S_{79}$ are closed, so that the bits $M_8$ to $M_0$ of the input data are supplied respectively to the input terminals $TD_8$ to $TD_0$ of the mantissa-part D/A conversion section 101.

In this embodiment, all of the above-described circuits are formed in a single chip of semiconductor.

The operation of this D/A converter 200 will now be described.

When a digital input data of sixteen bits $M_{15}$ to $M_0$ is supplied to the input terminals $IN_{15}$ to $IN_0$, the shift number detection circuit 107 determines, in accordance with the bits $M_{15}$ to $M_9$ of the input data, the number of bit "N" ("N" is one of "0" to "6") the data shift circuit 106 should shift the input data, and outputs the signal $P_N$. The data shift circuit 106 shifts in response to the signal $P_N$ the bits $M_{14}$ to $M_0$ of the input data in the direction of the higher significant bits by "N" bits, and outputs the result of the shift to the input terminals $TD_8$ to $TD_0$ of the mantissa-part D/A conversion section 101. The mantissa-part D/A conversion section 101 converts the magnitude of the data supplied to the input terminals $TD_8$ to $TD_0$ into an analog voltage having a polarity determined by the bit $M_{15}$ supplied to the input terminal $TD_9$ and outputs this voltage to the exponent-part D/A conversion section 102. The exponent-part D/A conversion section 102 then analogically shifts the voltage supplied from the mantissa-part D/A conversion section 101 by an amount determined by the signal $P_N$ and outputs the resultant voltage to the output terminal 22 as an output voltage $V_{OUT}$ which is expressed as follows:

$$V_{OUT} = \tfrac{1}{2} V_{DD} + \tfrac{1}{2} V_{DD}(-1 + M_{15} + M_{14-N} \cdot 2^{-1} + M_{13-N} \cdot 2^{-2} + M_{6-N} \cdot 2^{-9} + 2^{-10}) \cdot 2^{-N} \quad (3)$$

In the above formula (3), the "N" is determined, as described above, based on the number of leading bits of the input data which are different in state from the bit $M_{15}$.

With this D/A converter 200, in the case where the absolute value of the input data represented by the bits $M_{14}$ to $M_0$ thereof is large, only higher significant bits of the input data are supplied to the mantissa-part D/A conversion section 101 and the remaining lower significant bits thereof are neglected. In this case, however, the value represented by the neglected bits is sufficiently smaller than that represented by all of the bits $M_{14}$ to $M_0$, and therefore, the neglect of the lower significant bits has little effect on the output voltage $V_{OUT}$ of this D/A converter 200. On the other hand, in the case where the absolute value of the input data is small, lower significant bits of the input data are supplied to the mantissa-part D/A conversion section 101, and therefore, this D/A converter 200 can converts a small signal accurately. For example, in the case where the "N" is "6", the bits $M_8$ to $M_0$ of the input data are supplied to the mantissa-part D/A conversion section 101, and in addition the error which may occur in the conversion of these bits is rendered $2^{-6}$ times smaller, as will be appreciated from the formula (3), and therefore the zero-cross distortion of the output signal $V_{OUT}$ is minimized.

As described above, with the structure of this D/A converter 200, an error in D/A conversion at a small signal level is minimized, and the input digital data to be converted into an analog form may be applied thereto in the form of an ordinary fixed-point binary data, i.e., data composed only of binary weighted bits. Furthermore, this D/A converter 200 can easily be formed on a single chip of semiconductor to eliminate noise interference from the exterior circuits and to reduce its manufacturing cost. The D/A converter thus formed in a single chip of semiconductor is easy to use since digital data in the form of an ordinary binary data can be directly applied to the digital data input terminals thereof.

Though the described embodiments are examples in which a ten bit mantissa section and a six bit exponent section cooperatively convert sixteen bit digital data, the present invention is not limited thereto and each of the mantissa section and the exponent section may handle digital data of other bit structure to convert the sixteen bit digital data or to convert digital data other than sixteen bits.

What is claimed is:

1. A digital-to-analog converter for converting binary input data in fixed-point representation into an analog output signal comprising:
    (a) a data converting means for converting said fixed-point binary input data into floating point data composed of a mantissa part whose most significant bit is a sign bit and an exponent part representing a power of two by which the mantissa part is to be magnified, said converting means including means for determining the value of the exponent part in accordance with the absolute value of the binary input data;
    (b) digital-to-analog converting means for converting said mantissa part into a first analog signal within a range of single polarity, wherein said digital-to-analog converting means comprises an R-2R resistor ladder network, each 2R resistor of said R-2R resistor ladder network being supplied with a corresponding bit of said mantissa part, and said first analog signal being derived from one terminal end of said R-2R ladder network;
    (c) circuit means responsive to said first analog signal to produce a plurality of second analog signals of single polarity whose voltages are $2^{-n}$ ($n=0, 1, 2, 3, \ldots$) magnifications of said first analog signal, wherein said circuit means comprises a r-2r resistor ladder network directly connected at one terminal end thereof to said one terminal end of said R-2R ladder network for producing said second analog signals;
    (d) switch circuit means connected to said circuit means for selectively outputting one of said second analog signals as said analog output signal in accordance with said exponent part of said floating point data; and
    (e) bias means for applying a bias voltage to the circuit means to establish the center of the range of the analog output signal, wherein said r-2r resistor ladder network is supplied at one terminal of each 2r resistor thereof with said bias voltage to determine the center of range of said analog output signal.

* * * * *